US007064571B2

(12) United States Patent
Namekawa

(10) Patent No.: US 7,064,571 B2
(45) Date of Patent: Jun. 20, 2006

(54) MULTIPLE-SELECT MULTIPLEXER CIRCUIT, SEMICONDUCTOR MEMORY DEVICE INCLUDING A MULTIPLEXER CIRCUIT AND METHOD OF TESTING THE SEMICONDUCTOR MEMORY DEVICE

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 10/918,350

(22) Filed: Aug. 16, 2004

(65) Prior Publication Data

US 2005/0213394 A1    Sep. 29, 2005

(30) Foreign Application Priority Data

Mar. 24, 2004    (JP)    ............................. 2004-087166

(51) Int. Cl.
  *G01R 31/26*    (2006.01)
  *G11C 7/10*    (2006.01)
(52) U.S. Cl. .................. 324/765; 365/189.02
(58) Field of Classification Search ..................... None
    See application file for complete search history.

(56) References Cited

U.S. PATENT DOCUMENTS

| 4,941,126 A | 7/1990 | Haubursin |
| 6,115,301 A | 9/2000 | Namekawa |
| 6,243,317 B1 | 6/2001 | Haga et al. |
| 6,529,399 B1 | 3/2003 | Namekawa et al. |
| 6,529,406 B1 | 3/2003 | Namekawa |

FOREIGN PATENT DOCUMENTS

JP    2-235435    9/1990

*Primary Examiner*—Jermele Hollington
(74) *Attorney, Agent, or Firm*—Oblon, Spivak, McClelland, Maier & Neustadt, P.C.

(57) ABSTRACT

A multiplexer circuit is composed of several basic unit circuits, which are each supplied with a data signal and select signal. Each output terminal of several basic unit circuits is connected to a common line. Each basic unit circuit is composed of an unmatch detection circuit detecting an unmatch state of the common line and the data signal, a control circuit controlling drive timing of the common line when receiving a state transition of the select signal, and a tri-state buffer driving the common line according to a state of the data signal when an output of the unmatch detection circuit and an output of the control circuit are both in an active state while holds high impedance state when the state other than above is given.

23 Claims, 12 Drawing Sheets

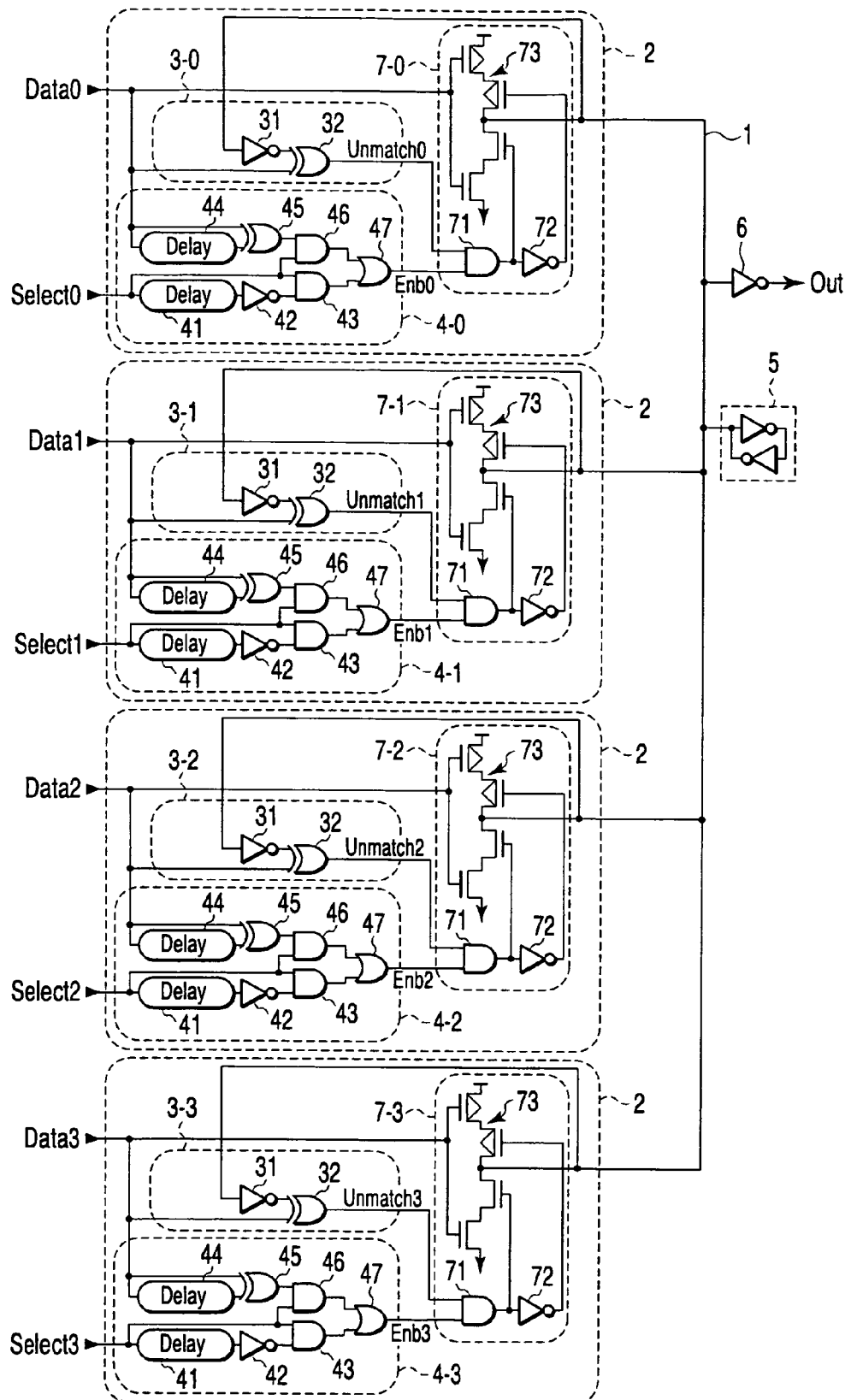
F I G. 1

MULTIPLE-SELECT MULTIPLEXER CIRCUIT, SEMICONDUCTOR MEMORY DEVICE INCLUDING A MULTIPLEXER CIRCUIT AND METHOD OF TESTING THE SEMICONDUCTOR MEMORY DEVICE

CROSS-REFERENCE TO RELATED APPLICATIONS

This application is based upon and claims the benefit of priority from prior Japanese Patent Application No. 2004-087166, filed Mar. 24, 2004, the entire contents of which are incorporated herein by reference.

BACKGROUND OF THE INVENTION

1. Field of the Invention

The present invention relates to a multiple-select multiplexer circuit, a semiconductor memory device including a multiplexer circuit, and a memory segment parallel test method of the semiconductor memory device.

2. Description of the Related Art

For example, wired OR logic is employed to form a multiplexer circuit, which selects one data line from several data lines provided in a semiconductor memory. In the wired OR logic, several drivers makes cascade connection with respect to one line (conducting path, interconnection). Two kinds, that is, domino circuit and tri-state buffer have been known as the driver.

In general, the wired OR logic using the domino circuit is composed of only NMOSFET having relatively small parasitic capacitance and high current driving capability. Thus, the high-speed operation is expected when multiple-input logic is formed. However, pre-charge and discharge operations are repeated in one-time logic operation; for this reason, current consumption becomes large, and also, cycle time becomes long.

On the other hand, the wired OR logic using the tri-state buffer has the problem described below. If an accident such as simultaneous select happens in the tri-state buffer, current exceeding 10 mA flows to a line in which several output nodes of the tri-state buffer are commonly connected. As a result, there is a possibility that damage is given to lines and semiconductor elements. In particular, if the foregoing accident happens in a burn-in operation such that high power supply voltage is applied, it is getting more and more serious.

JPN. PAT. APPLN. KOKAI Publication No. 2-235435 discloses the following configuration. According to the configuration, a tri-state buffer is added to an output buffer, and output nodes of the output and tri-state buffers makes wired OR connection. An output level detection circuit detects the output level of the output buffer, and the drive of the tri-state buffer is controlled in accordance with the detection result. By doing so, the driving capability is improved at the rise or fall period of the output waveform. However, the technique described in the Publication 2-235435 does not solve the problem peculiar to multiplexers although it enhances the rise or fall speed of the output waveform.

BRIEF SUMMARY OF THE INVENTION

According to a first aspect of the present invention, there is provided a multiplexer circuit including:

a plurality of basic unit circuits each supplied with a data signal and a select signal, and having an output terminal;

a common line connected commonly to the output terminal of the basic unit circuits; and an output buffer connected to the common line, and outputting the signal of the common line, the basic unit circuits each including:

an unmatch detection circuit detecting an unmatch state of the data signal with the signal of the common line; and a tri-state buffer connected to the unmatch detection circuit, and driving the common line according to a state of the data signal when the unmatch detection circuit detects an unmatch state of the data signal with the signal of the common line.

According to a second aspect of the present invention, there is provided a semiconductor memory circuit device including:

a plurality of memory segments each including: a memory cell array having matrix-like arrayed memory cells; a row decoder for selecting one row of the memory cell array; a segment select circuit outputting a segment select signal for selecting the row decoder in accordance with a first control signal and an address signal; a plurality of data lines outputting a plurality of-bit read data read from the row of the memory cell array selected by the row decoder; and a plurality of first basic unit circuits each having an output terminal, supplied with the segment select signal and a second control signal, and provided by the number corresponding to the a plurality of data lines;

a plurality of common lines connected commonly with the output terminals of a plurality of basic unit circuits of the corresponding column of the first basic unit circuits; and a plurality of output buffers connected to the common lines, and outputting signals of the common lines, the first basic unit circuits each including:

a first unmatch detection circuit detecting an unmatch state of each data signal with each signal of the common lines;

a first drive timing control circuit supplied with an output signal of the first unmatch detection circuit, the data signal, the segment select signal and the second control signal, outputting the select signal and an output signal of the segment select circuit in accordance with the output signal of the first unmatch detection circuit when the second control signal is in a non-active state while keeping an old output state when the second control signal is in an active state; and a first tri-state buffer receiving an output signal of the first drive timing control circuit, driving each of the common lines according to a state of the data signal in synchronous with the second control signal, and keeping a state for an active period of the second control signal while the output becomes high impedance state when the second control signal becomes a non-active state;

in a normal operation, memory cells included in one row of one memory segment being selected by the combination of the segment select signal and the address signal, and data signals read from memory cells equivalent to one row being each outputted to the corresponding common lines via the corresponding first basic unit circuits, in a burn-in operation in a state after the device is packaged, a plurality of segment signals being simultaneously activated regardless of a state of the address signal, and a plurality of data signals read from memory cells included in all memory segments being read in parallel to the common lines via the first basic unit circuits.

BRIEF DESCRIPTION OF THE SEVERAL VIEWS OF THE DRAWING

FIG. 1 is a circuit diagram showing the configuration of an asynchronous multiplexer circuit according to a first embodiment of the present invention;

DETAILED DESCRIPTION OF THE INVENTION

First Embodiment

Figure 2:
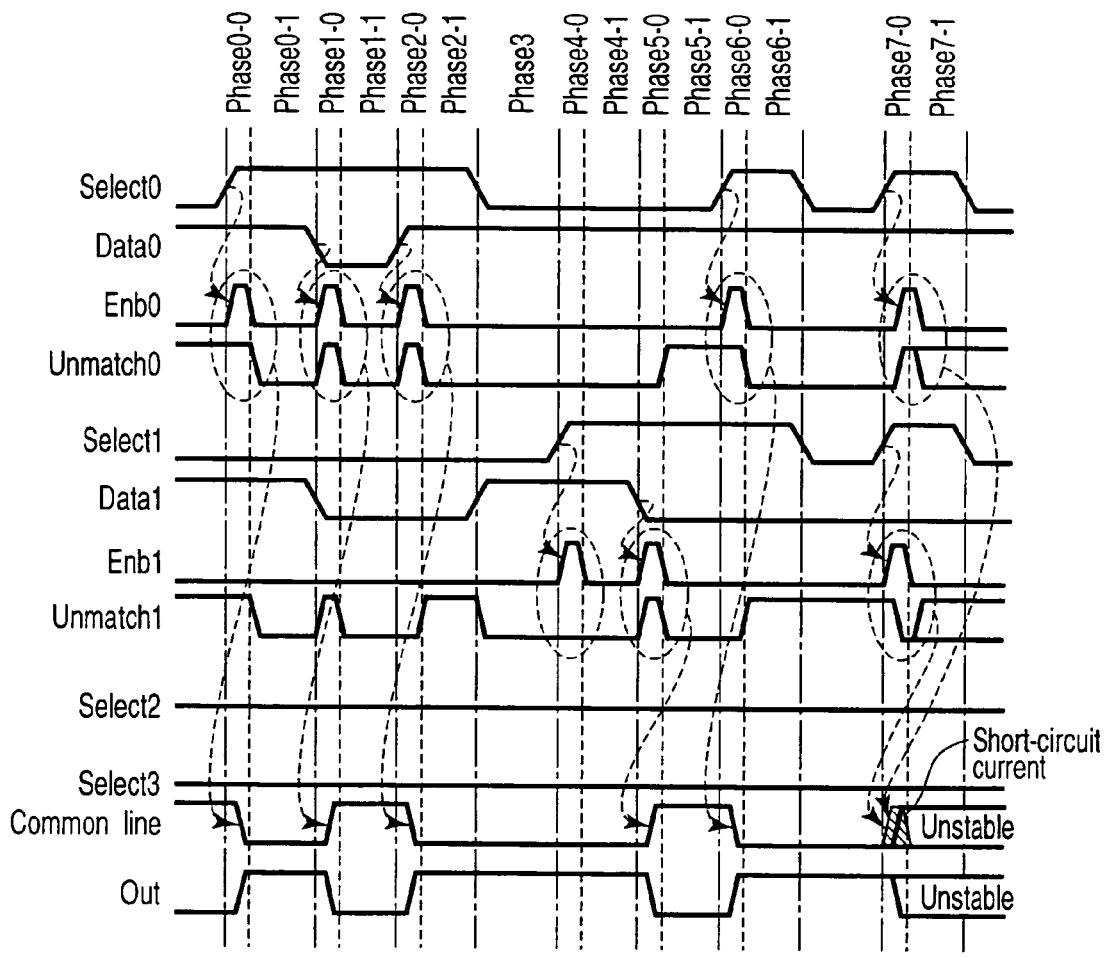
FIG. 2 is a waveform chart to explain the operation of the multiplexer circuit shown in FIG. 1.

FIG. 1 is a circuit diagram showing the configuration of an asynchronous multiplexer circuit according to a first embodiment of the present invention. The multiplexer circuit is built in an LSI. The multiplexer circuit has several, that is, four basic unit circuits 2, common line 1, state holding circuit 5 and output buffer 6. The common line 1 is commonly connected with each output terminal of the basic unit circuit 2, which makes wired OR connection. The state holding circuit 5 is connected to the common line 1, and has minute output current for holding a signal in the common line 1. The output buffer 6 receives the signal of the common line 1 to generate an output signal (out).

The basic unit circuits 2 each includes unmatch detection circuit 3-i (i=0~3), drive timing control circuit 4-i (i=0~3), and synchronous tri-state buffer 7-i (i=0~3).

The unmatch detection circuit 3-i (i=0~3) detects unmatch of a data signal datai (i=0~3) with the signal state of the common line 1. The drive timing control circuit 4-i (i=0~3) receives the signal datai (i=0~3) and a state transition of a select signal selecti to control a drive timing of the common line 1. The tri-state buffer 7-i (i=0~3) drives the common line 1 in accordance with the state of the signal datai when output signals of the unmatch detection circuit 3-i and drive timing control circuit 4-i are both at the level "1". Unmatch of the signal datai detected by unmatch detection circuit 3-i and the state of the common line 1 means the following matter. The potential of the common line 1 after the tri-state buffer 7-i drives the common line 1 in accordance with the state of the data signal datai is unmatched with the potential of the common line 1 before it drives.

The unmatch detection circuit 3-i is composed of an inverter circuit 31 and an exclusive OR logic circuit 32. The inverter circuit 31 inverts the signal of the common line 1. The exclusive OR logic circuit 32 inputs an output signal of the inverter circuit 31 and the signal datai, and outputs an unmatch signal unmatchi (i=0~3). The unmatch detection circuit 3-i compares the state of the common line 1 with the state of the signal datai, and generates the signal unmatchi of high potential (level "1") only when these signals are mutually unmatched.

The drive timing control circuit 4-i is composed of delay circuits (delay) 41 and 44, inverter circuit 42, AND logic circuits 43 and 46, exclusive OR logic circuit 45, and OR logic circuit 47. The delay circuit 41 delays the select signal selecti. The inverter circuit 42 inverts an output signal of the delay circuit 41. The AND logic circuit 43 inputs an output signal of the inverter circuit 43 and the signal selecti. The delay circuit 41 delays the signal datai. The exclusive OR logic circuit 45 inputs an output signal of the delay circuit 44 and the signal datai. The AND logic circuit 46 inputs an output signal of the exclusive OR logic circuit 45 and the signal selecti. The OR logic circuit 47 inputs each output of both AND logic circuits 43 and 46, and outputs a drive timing signal enbi (i=0~3).

The drive timing control circuit 4-i generates a drive timing control signal enbi described below. The drive timing control signal enbi enables a signal to high potential for only predetermined time after either of the following transitions is made. One is a transition such that the state of the signal selecti transfers from low potential to high potential, that is, from non-select state to select state. Another is a transition such that the state of the signal datai, which is in a state of selecting the signal selecti, transfers.

The tri-state buffer 7-i is composed of AND logic circuit 71, inverter circuit 72 and CMOS clocked inverter circuit 73. The AND logic circuit 71 inputs the output signal unmatchi of the unmatch detection circuit 3-i and the output signal enbi of the drive timing control circuit 4-i. The inverter circuit 72 inverts an output signal of the AND circuit 71. The CMOS clocked inverter circuit 73 inputs the signal datai, and is driven by each output signal of the AND logic circuit 71 and the inverter circuit 72. The tri-state buffer 7-i drives the common line 1 according to the signal datai when the drive timing control signal enbi and the unmatch signal unmatchi are both high potential (active state). In the following description, a state "1" is set when the state of the signal datai is high potential; on the other hand, a state "0" is set when it is low potential. A signal in which the signal datai is inverted by the CMOS clocked inverter circuit 73 is outputted to the common line 1. In other words, the relation between the potential and state of the common line 1 is negative logic. For this reason, in the following description, a state "0" is set when the state of the common line 1 is high potential; on the other hand, a state "1" is set when it is low potential.

FIG. 2 is a waveform chart to explain the operation of the multiplexer circuit shown in FIG. 1. The asynchronous multiplexer circuit shown in FIG. 1 does not require a clock signal for controlling operation timing. The state of the common line 1 is compared with the state of the signal datai (part of data signals, that is, only data0 and data1 are shown). Only when the foregoing states are different, the tri-state buffer 7-i drives the common line 1. In cases other than above, the output of the tri-state buffer 7-i is held at a high impedance state. The state of the common line 1 is outputted as the output signal out from the output buffer 6. In other words, the state of the signal datai in which the select signal selecti is high potential (active, that is, select state) is outputted as the output signal.

The operation shown in FIG. 2 will be explained below. As shown in FIG. 2, the operation is divided into several periods, that is, phase0-0 to phase 7-1. In the phase0-0, a first select signal select0 transfers from a non-select state to a select state. In this case, the signal select0 and a signal inverted by the inverter circuit 42 after the signal select0 is delayed by the delay circuit 41 are inputted to the AND logic circuit 43. A pulse signal giving high potential for predetermined time is generated. The pulse signal functions as a drive timing control signal enb0 via the OR logic circuit 47. Simultaneously, the unmatch detection circuit 3-0 generates an unmatch signal unmatch0 in accordance with the state of the common line 1 and the signal data0. The common line 1 is high potential, that is, the state "0"; on the other hand, the signal data0 is high potential, that is, the state "1". Thus, the unmatch signal unmatch0 becomes high potential, that is, unmatch state. Upon receiving the signal data0, the tri-state buffer 7-0 drives the common line 1 to low potential, that is, the state "1" for a period when the timing control signal enb0 and the unmatch signal unmatch0 are both high potential. Finally, upon receiving low potential of the common line 1, the signal out transfers to high potential, that is, the state "1".

Thereafter, in the phase0-1, the signal data0 is the state "1"; on the contrary, the common line 1 becomes the state "1". Therefore, the unmatch signal unmatch0 becomes low potential state, that is, match state. The state transition described above is given, and thereby, the tri-state buffer 7-0 becomes high impedance state, that is, a state of negating the drive of the common line 1. In this case, the common line 1 is held to low potential by the state holding circuit 5, and the signal out is held to the state "1".

In the phase1-0, the first select signal select0 is continuously kept at the select state, while the signal data0 transfers from high potential to low potential, that is, from the state "1" to the state "0". In this case, a pulse generator circuit is composed of the delay circuit 44 supplied with the signal data0 and the exclusive OR logic circuit 45. The pulse generator circuit is operated to a pulse signal giving high potential for predetermined time. AND logic with the select signal select0 is built up, and thereafter, the pulse signal becomes drive timing signal enb0 via the OR logic circuit 47. Simultaneously, the unmatch detection circuit 3-0 receives the state of the common line 1 and the signal data0, and generates the unmatch signal unmatch0. The common line 1 is low potential, that is, the state "1" while the signal data0 is low potential, that is, the state "0". Thus, the unmatch signal unmatch0 becomes high potential, that is, unmatch state. Upon receiving the signal data0, the tri-state buffer 7-0 drives the common line 1 to high potential, that is, the state "0" for a period when the timing control signal enb0 and the unmatch signal unmatch0 are both high potential. Finally, upon receiving high potential of the common line 1, the output signal out transfers to low potential, that is, the state "0".

Thereafter, in the phase1-1, the signal data0 is the state "0", and also, the common line 1 becomes the state "0". Therefore, the unmatch signal unmatch0 becomes low potential state, that is, match state. The state transition described above is given, and thereby, the tri-state buffer 7-0 becomes high impedance state, that is, a state of negating the drive of the common line 1. In this case, the common line 1 is held to low potential by the state holding circuit 5, and the output signal (out) is held to the state "0".

In the phase2-0, the first select signal select0 continuously keeps the select state, while the signal data0 transfers from low potential to high potential, that is, from the state "0" to the state "1". The operation is the same as the foregoing phase 1-0 except that the data state is different; therefore, the explanation is omitted. The output signal out transfers to the state "1".

Thereafter, in the phase2-1, the signal data0 is the state "1", and also, the common line 1 becomes the state "1". Therefore, the unmatch signal unmatch0 becomes low potential state, that is, match state. The state transition described above is given, and thereby, the tri-state buffer 7-0 becomes high impedance state, that is, a state of negating the drive of the common line 1. In this case, the common line 1 is held to low potential by the state holding circuit 5, and the output signal is held to the state "1".

Other select signals select1, select2 and select3 continue to hold low potential for the period from the phase 0-0 to the phase 2-1. Thus, other tri-state buffers 7-1, 7-2 and 7-3 become high impedance state. Consequently, no current other than charge and discharge currents to interconnection capacitance flows to the common line 1.

In the phase3, when the first select signal select0 transfers from select state to non-select state, the drive timing control signal enb0 continues to hold low potential. Therefore, the common line 1 and the output signal out are unchanged, and hold the state "1".

In the phase4-0, a second select signal select1 transfers from a non-select state to a select state. Upon receiving the change of the second select signal select1, the drive timing control signal enb1 becomes high potential for predetermined time. Simultaneously, the unmatch detection circuit 3-1 generates an unmatch signal unmatch1 in accordance with the state of the common line 1 and the signal data0. The common line 1 is low potential, that is, the state "1"; on the other hand, the signal data1 is high potential, that is, the state "1". Thus, the unmatch signal unmatch1 becomes low potential, that is, match state. Since the unmatch signal unmatch1 becomes low potential, the tri-state buffer 7-1 keeps high impedance state. Finally, the output signal out holds high potential, that is, the state "1".

As seen from the foregoing description, the state of the common line has no changed if the state of the selected data signal is the same as the common line. In other words, the old state of the output signal out is kept, and thereby, a desired state is given.

In the phase5-0, the second select signal select1 continuously keeps the select state, while the signal data1 transfers from high potential to low potential, that is, from the state "1" to the state "0". The operation is the same as the case where the first select signal select0 continuously keeps the select state while the first data signal data0 transfers from the state "1" to the state "0" in the foregoing phase 1-0. Therefore, the explanation is omitted. The operation is carried out, and thereby, the output signal out transfers to low potential, that is, the state "0".

In the phase6-0, the second select signal select1 keeps the select state while the first select signal select0 transfers from non-select state to select state. Thus, different data signals (data0, data1) are selected according to several select signals (select0, select1). In this case, short-circuit current flows into a conventional tri-state type multiplexer circuit; for this reason, the multiplexer circuit falls into a dangerous state.

However, the dangerous state is avoided in the multiplexer circuit of the present embodiment as seen from the following explanation.

More specifically, when the first select signal select0 transfers from non-select state to select state, the drive timing control circuit 4-0 is operated so that the drive timing signal enb0 becomes high potential for predetermined time. The first data signal data0 is high potential, that is, the state "1"; on the contrary, the common line 1 is high potential, that is, the state "0". Thus, the unmatch signal unmatch0 of the first unmatch detection circuit 3-0 becomes high potential, that is, unmatch state. The first tri-state buffer 7-0 drives the common line 1 to low potential, that is, state "1" for the period when the drive timing control signal enb0 and the unmatch signal unmatch0 are both high potential. At that time, the second select signal select1 and the second data signal data1 both hold the state. Therefore, the drive timing signal enb0 of the second drive timing control circuit 4-1 keeps low potential.

By doing so, the second tri-state buffer 7-1 keeps high impedance state; therefore, no short-circuit current flows to the common line 1.

Finally, in the phase7-0, several select signals (select0, select1) transfer at approximately the same time, that is, the first select signal select0 transfers from non-select state to select state after slightly delayed from the second select signal select1. As seen from the phase7-0, if selected data signals (data0, data1) are mutually different, several tri-state buffers 7-0 and 7-1 are simultaneously activated to mutually drive the common line 1 to different state. Thus, the state of the common line 1 becomes unstable; as a result, the output signal out also becomes unstable. This is not a preferable state in the circuit operation. However, illegal input calling multiple select is given, and thus, it is correct result that the output is not uniquely determined. In this case, short-circuit current flows via the common line 1. However, the delay time of the delay circuits 41 and 44 is set to the time identical to the state transition time of the common line 1. By doing so, it is possible to sufficiently prevent elements and interconnections from receiving damage caused by short-circuit current.

As described above, the asynchronous multiplexer circuit according to the first embodiment does not require precharge operation; therefore, high-speed cycle operation is achieved.

Second Embodiment

Figure 3:
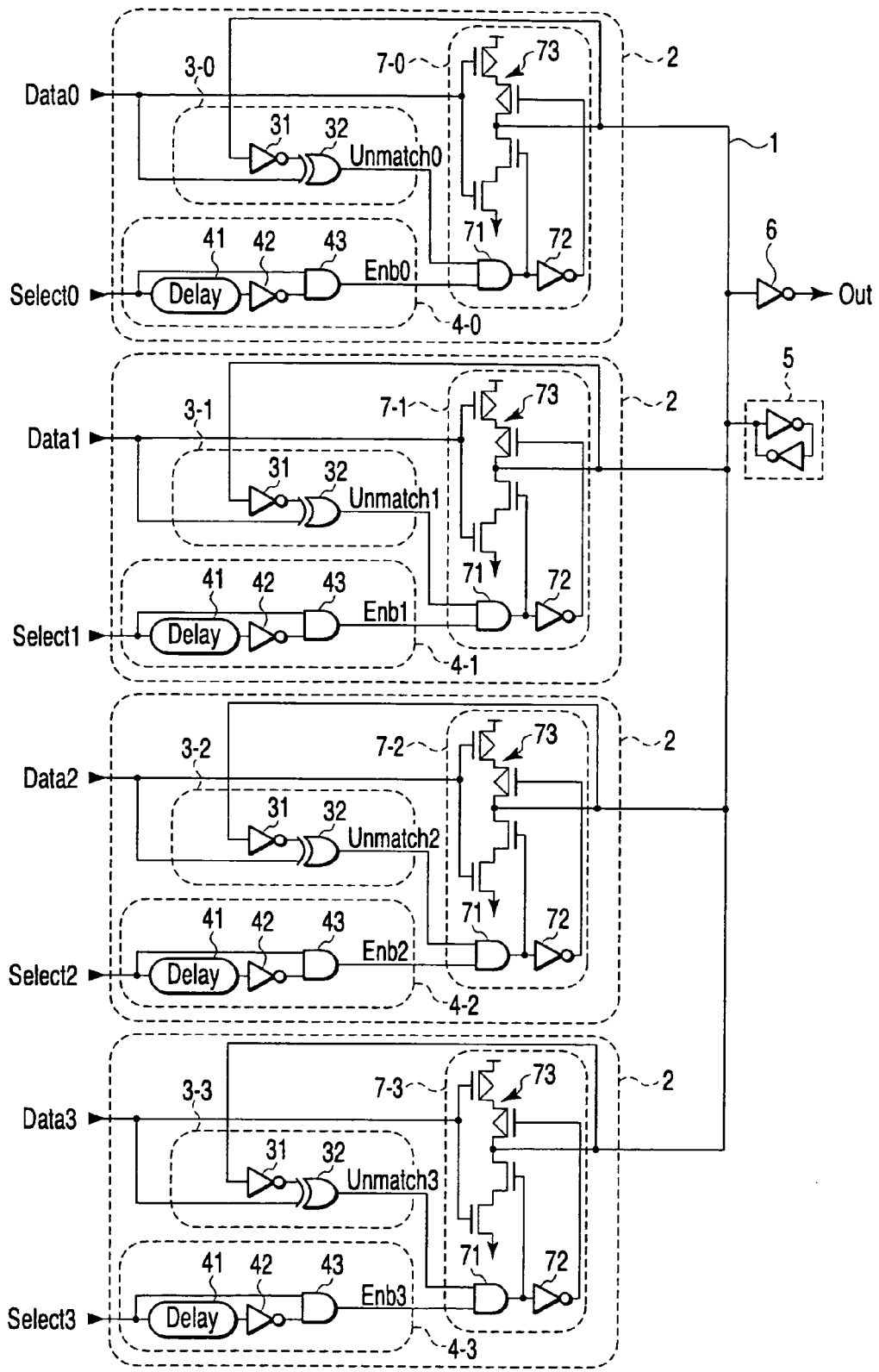
FIG. 3 is a circuit diagram showing the configuration of an asynchronous multiplexer circuit according to a second embodiment of the present invention.

FIG. 3 is a circuit diagram showing the configuration of an asynchronous multiplexer circuit according to a second embodiment of the present invention. The multiplexer circuit of the second embodiment differs from the multiplexer circuit of the first embodiment described in FIG. 1 in the following point. The drive timing control circuit 4-i has the circuit configuration different from the first embodiment. Other configuration is the same; therefore, the same reference numerals are given to components corresponding to FIG. 1.

More specifically, the drive timing control circuit 4-i is not provided with delay circuit 44, exclusive OR logic circuit 45, AND logic circuit 46 and OR logic circuit 47, unlike the circuit described in FIG. 1. In addition, the output signal of the AND logic circuit 43 is used as a drive timing signal enbi. The drive timing control circuit 4-i having the foregoing configuration generates the following drive timing signal enbi. The drive timing signal enbi gives high potential for only predetermined time from time when the state of the select signal selecti transfers from low potential to high potential, that is, from non-select state to select state.

Figure 4:
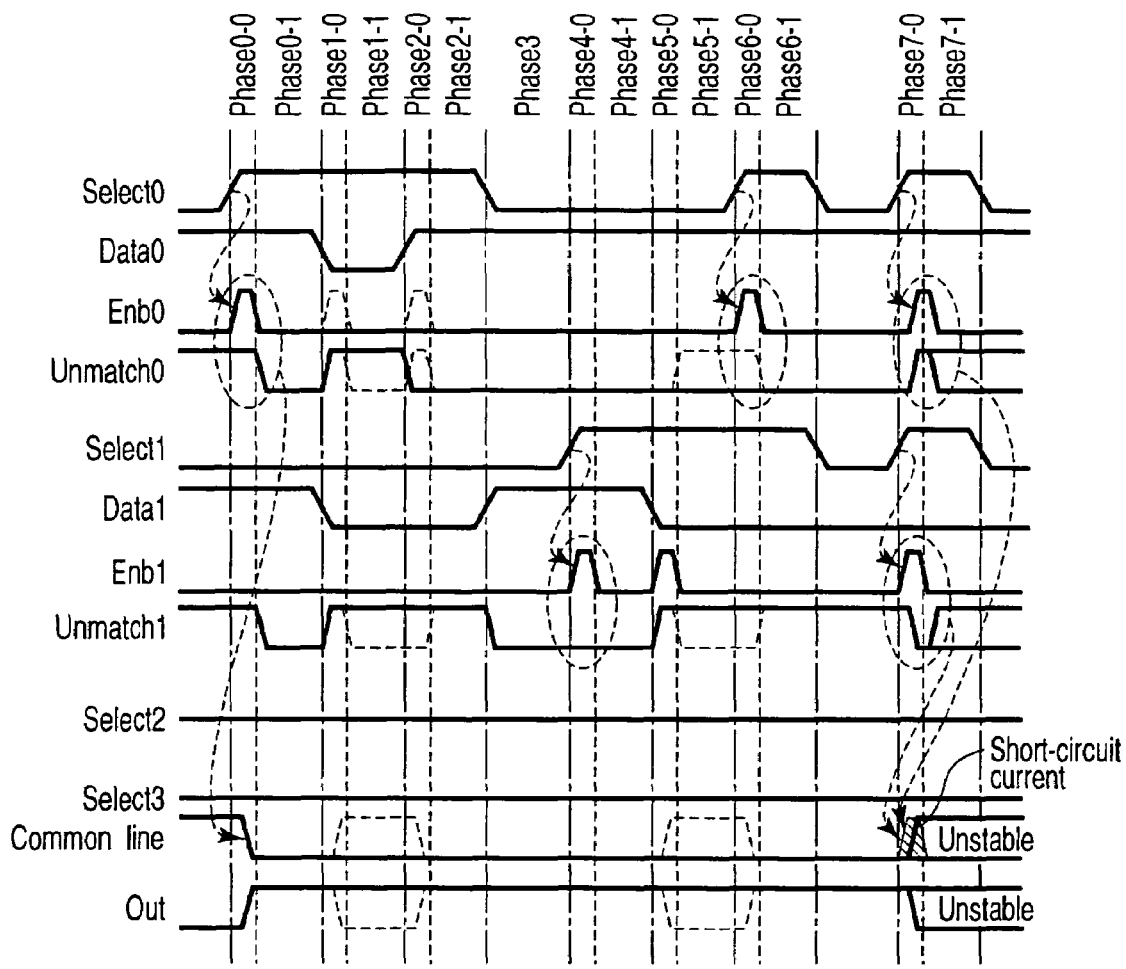
FIG. 4 is a waveform chart to explain the operation of the multiplexer circuit shown in FIG. 3.

FIG. 4 is a waveform chart to explain the operation of the multiplexer circuit shown in FIG. 3. In FIG. 4, the operation waveform of the multiplexer circuit of the first embodiment is shown for comparison. The operation of the multiplexer circuit of the second embodiment is the same as that of the first embodiment described in FIG. 2; therefore, the details are omitted. Only difference in the operation between the multiplexer circuits of the first and second embodiments will be explained below.

The asynchronous multiplexer circuit shown in FIG. 3 does not require a clock signal for controlling the operation timing. However, when the following transition is given, the output buffer 6 outputs a state of the selected data signal datai (only data0 and data1 are shown in FIG. 4) as the output signal. The transition is timing when the select signal selecti transfers from low potential to high potential, that is, from non-select state to select state. In other words, the state of the signal datai in which the select signal selecti is high potential, that is, in the select state is outputted to the output node as the signal out.

The operation will be explained below. As shown in FIG. 4, the operation is divided into several periods, that is, phase0-0 to phase 7-1. As seen from phase0-0, phase4-0 and phase6-0 in FIG. 4, the operation when any one of select signals select0 to select3 transfers from low potential to high potential, that is, from non-select state to select state is the same as the first embodiment.

The corresponding drive timing control signals enbi (only enb0 and enb1 are shown in FIG. 4) become high potential, that is, activated state for predetermined time from time when select signals select0 to select3 transfer. Concurrently with the operation described above, the unmatch detection circuit 3-i compares the state of the common line 1 with the state of each signal datai (only data0 and data1 are shown in FIG. 4). Then, the unmatch detection circuit 3-i generates the unmatch signal unmatchi (only unmatch0 and unmatch1 are shown in FIG. 4).

The tri-state buffer 7-i drives the common line 1 for the period when the corresponding drive timing control enbi and unmatch signal unmatchi are both high potential. Upon receiving the state of the common line 1, the signal out becomes the state of the signal datai selected by the select signal selecti.

On the other hand, as seen from phase1-0, phase2-0 and phase5-0 in FIG. 4, the operation when the signal datai transfers while the select signal selecti is high potential, that is, keeps the select state is different from the first embodiment. According to the second embodiment, the drive timing control circuit 4-i includes no circuit for detecting the state transition of the signal datai. In other words, even if the state of the signal datai transfers, the drive timing control signal enbi keeps low potential, that is, continues a non-active state. Therefore, the state holding circuit 5 holds the state of the common line 1 without activating any tri-state buffers 7-i. As a result, the state of the signal out is unchanged at the timing when the signal datai transfers. The operation of phase3 and phase7-0 other than phase0-0, phase4-0, phase6-0 phase1-0, phase2-0 and phase5-0 is the same as the first embodiment.

The second embodiment shows the asynchronous multiplexer circuit, which carries out specific timing control. The specification of the select signal selecti may be variously modified. The any number of the basic unit circuits 2 may be provided so long as it is more than two.

In the first and second embodiments, the relation between the potential and state of the common line 1 is negative logic. The configuration of internal logic circuits is changed, and thereby, positive logic may be employed. Likewise, the circuit configuration may be variously modified in drive timing control circuit 4-i, tri-state buffer 7-i, state holding circuit 5 and output buffer 6.

Third Embodiment

Figure 5:
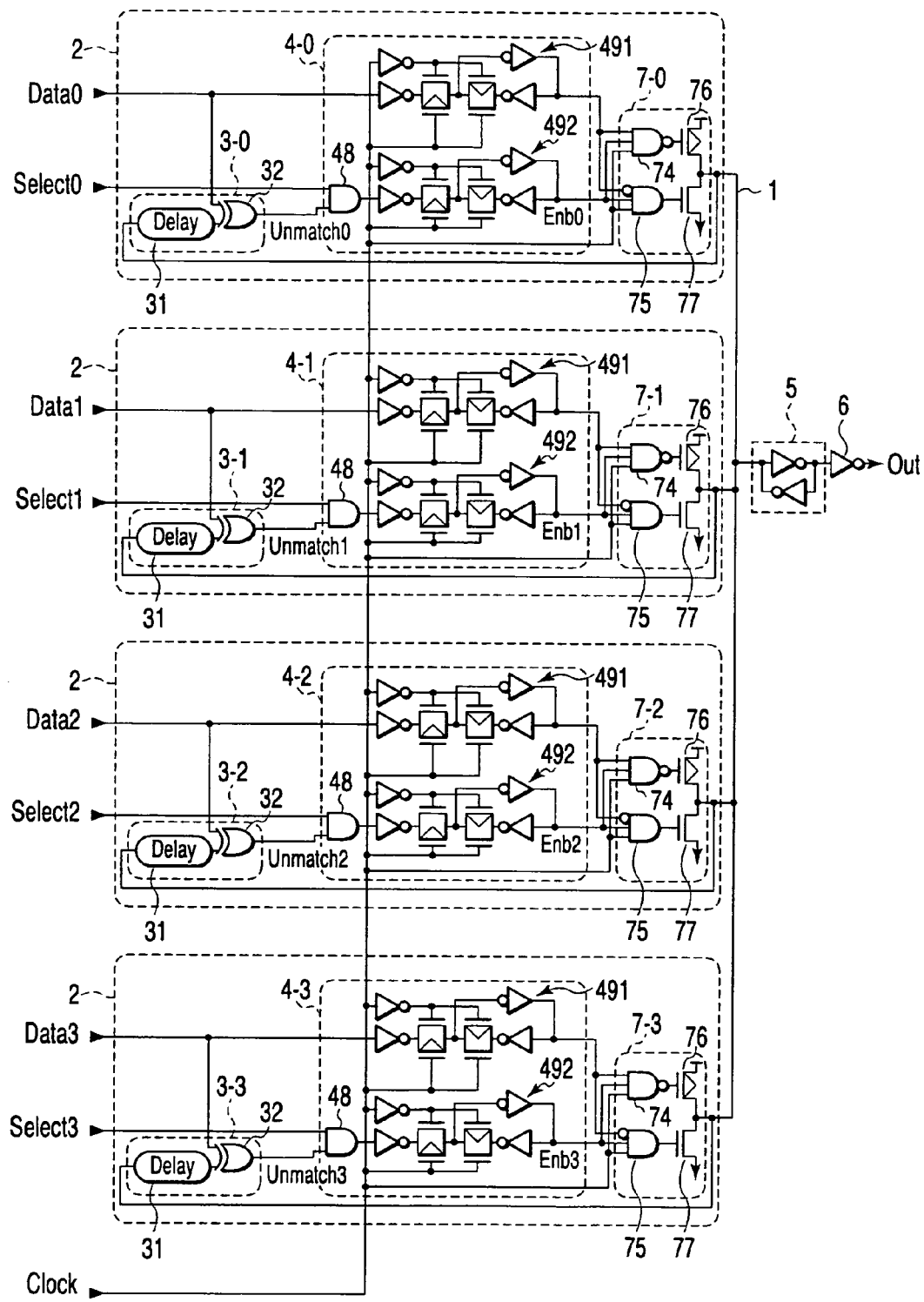
FIG. 5 is a circuit diagram showing the configuration of a synchronous multiplexer circuit according to a third embodiment of the present invention.

FIG. 5 is a circuit diagram showing the configuration of a synchronous multiplexer circuit according to a third embodiment of the present invention. The multiplexer circuit is composed of four basic unit circuits 2, common line 1, state holding circuit 5 and output buffer 6. The basic unit circuits 2 input a signal datai and a select signal selecti. The common line 1 is commonly connected with each output terminal of the basic unit circuits 2. The state holding circuit 5 holds the state of the common line 1. The output buffer 6 receives a signal of the common line 1 to generate an output signal out.

The basic unit circuits 2 each commonly input a clock signal clock for controlling operation timing. The basic unit circuits 2 each includes unmatch detection circuit 3-i, drive timing control circuit 4-i, and synchronous tri-state buffer 7-i. The basic unit circuits 2 each input the signal datai and the select signal selecti. Then, the basic unit circuits 2 each output a state of the signal datai to the common line 1 in synchronous with the clock signal. In this case, the select signal selecti is high potential, that is, the data signal datai is in a select state.

The unmatch detection circuit 3-i is composed of a delay circuit (delay) 31 for delaying the signal of the common line 1, and an exclusive OR logic circuit 32 for outputting an unmatch signal unmatchi. The unmatch detection circuit 3-i compares both states of the common line 1 and the signal datai, and thereafter, generates the unmatch signal unmatchi giving high potential only when the state is unmatch. The delay circuit 31 performs a function of obtaining hold margin of the common line 1 with respect to the clock signal.

The drive timing control circuit 4-i is composed of an AND logic circuit 48, two D-type latch circuits 491 and 492. The AND logic circuit 48 inputs the select signal selecti and the output signal unmatchi of the unmatch detection circuit 3-i. The D-type latch circuits 491 and 492 are supplied with the signal datai and an output signal of the AND logic circuit 48, and driven by the clock signal. The drive timing control circuit 4-i outputs a sate of an input signal when the clock signal is low potential while holding the output when it is high potential. In this case, one D-type latch circuit 491 relays the signal datai, and the other D-type latch circuit 492 relays the unmatch signal unmatchi to output a drive timing signal enbi.

The tri-state buffer 7-i is composed of AND circuits 74, 75, PMOSFET 76 and NMOSFET 77. The AND circuit 74 is supplied with output signals of two D-type latch circuits 491 and 492 and the clock signal. The AND logic circuit 75 is supplied with an inverted signal of the output signal of the D-type latch circuit 491, the output signal of the D-type latch circuit 492 and the clock signal. The PMOSFET 76 has a gate supplied with an output signal of the AND logic circuit 74; on the other hand, the NMOSFET 77 has a gate supplied with an output signal of the AND logic circuit 75.

The tri-state buffer 7-i drives the common line 1 in accordance with the state of the signal datai when the following state is given. That is, the select signal selecti when the clock signal transfers from low potential to high potential and the unmatch signal unmatchi are both high potential, that is, active state. On the other hand, when any one or both of the select signal selecti and the unmatch signal unmatchi are low potential, the output of the tri-state buffer 7-i becomes high impedance. The foregoing state of the tri-state buffer 7-i is kept for the period when the clock signal is high potential even if each state of signal datai, select signal selecti and common line 1 changes. When the clock signal becomes low potential, the outputs of all tri-state buffers 7-i becomes high impedance. In this case, the state holding circuit 5 keeps the state of the common line 1 to prevent the output signal out from unnecessarily transferring.

Figure 6:
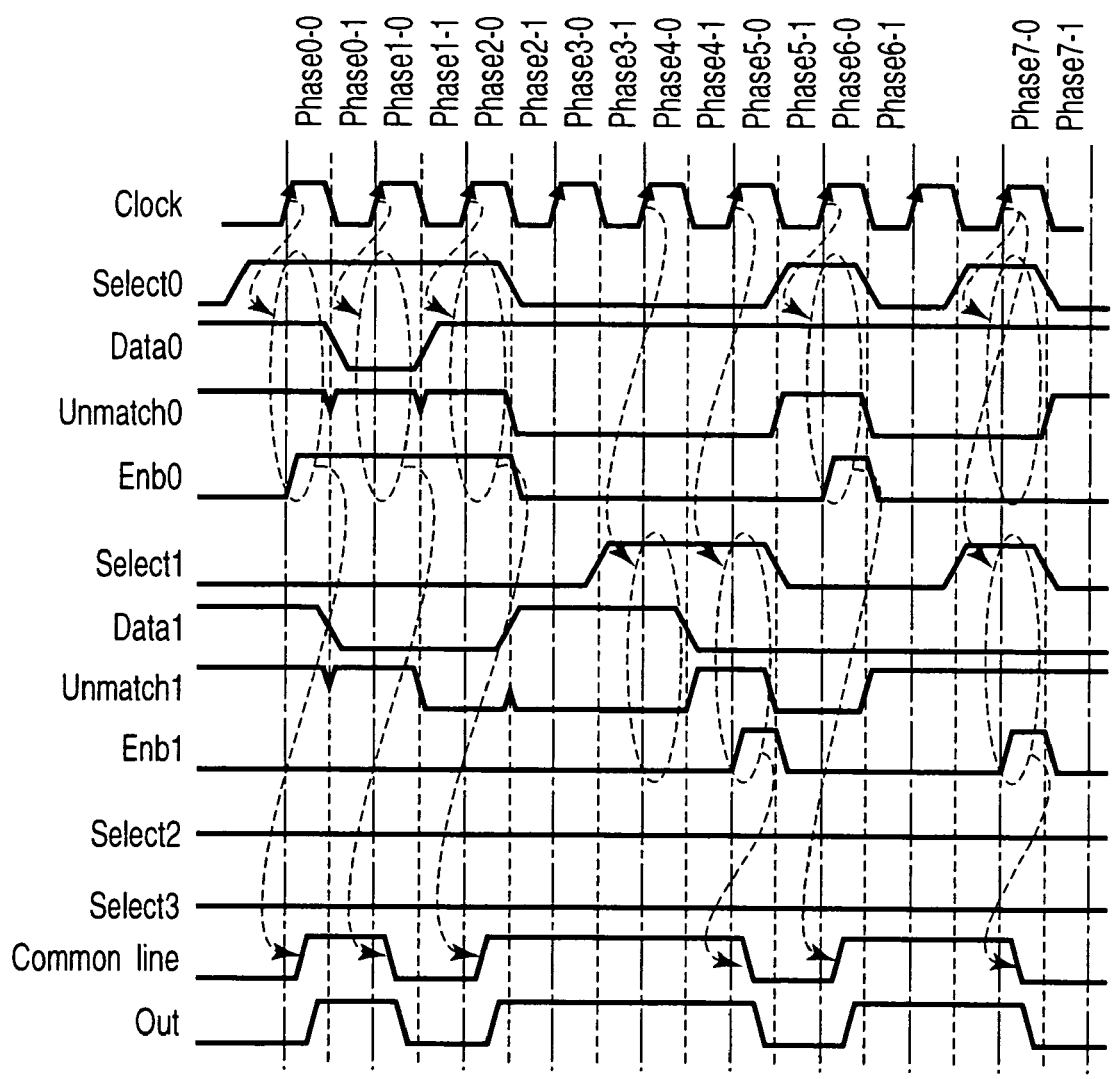
FIG. 6 is a waveform chart to explain the operation of the multiplexer circuit shown in FIG. 5.

FIG. 6 is a waveform chart to explain the operation of the multiplexer circuit shown in FIG. 5. As seen from phase0-0, phase2-0 and phase6-0, first select signal select0, first data signal data0 and common line 1 are individually in the following state when the clock signal transfers to high potential. The first select signal select0 is high potential, that is, select state, the first data signal data0 is high potential, that is, a state "1", and the common line 1 is low potential, that is, a state "0". In this case, the state of the first data signal data0 is unmatch with that of the common line 1; therefore, the unmatch signal unmatch0 is high potential, that is, an unmatch state. The unmatch signal unmatch0 and the first select signal select0 are inputted to the AND circuit 48. Whereupon the output of the AND circuit 48 becomes a drive timing control signal enb0 via the second D-type latch circuit 492 controlled by the clock signal, and then, inputted to a first tri-state buffer 7-0. On the other hand, the first data signal data0 is also inputted to a first tri-state buffer 7-0 via the first D-type latch circuit 491. The signal (first data signal data0) latched by the first D-type latch circuit 491 is transmitted to the first tri-state buffer 7-0 for the period when the clock signal is low potential. The state of the signal is determined when the clock signal transfers to high potential, and thereafter, kept at high potential for the period when the clock signal is high potential.

In other words, the first tri-state buffer 7-0 drives the common line 1 at high potential for the period when the clock signal is high potential. In this case, other tri-state buffers 7-1, 7-2 and 7-3 individually become high impedance state because the corresponding select signals select1, select2 and select3 are low potential. Thus, the common line 1 transfers to high potential, and receiving the transition, the output signal out becomes high potential, that is, the state "1".

In the phase1-0, first select signal select0, first data signal data0 and common line 1 are individually in the following state when the clock signal transfers to high potential. The first select signal select0 is high potential, that is, select state, the first data signal data0 is low potential, that is, a state "0", and the common line 1 is high potential, that is, a state "1". In this case, the operation is the same as described in the foregoing phase0-0, phase2-0 and phase6-0, except that the common line 1 is driven to low potential. As a result, the output signal out becomes low potential, that is, the state "0".

In the phase5-0, second select signal select1, second data signal data1 and common line 1 are individually in the following state when the clock signal transfers to high potential. The second select signal select1 is high potential, that is, select state, the second data signal data1 is low potential, that is, a state "0", and the common line 1 is high potential, that is, a state "1". In this case, the operation is the same as described in the foregoing phase1-0, except that the second tri-state buffer 7-1 operates. As a result, the output signal out becomes low potential, that is, the state "0".

In phase0-1 to phase7-1, all tri-state buffers 7-i become high impedance state for the period when the clock signal is low potential regardless of each sate of the signal datai and select signal selecti. Thus, the common line 1 is kept at the old state by the state holding circuit 5, and also, the output out is kept at the old state.

In the phase4-0, second select signal select1, second data signal data1 and common line 1 are individually in the following state when the clock signal transfers to high potential. The second select signal select1 is high potential, that is, select state, the second data signal data1 is high potential, that is, a state "1", and the common line 1 is high potential, that is, a state "1". The operation is part of the features of the third embodiment. The state of the second data signal data1 is match with that of the common line 1. Therefore, a second unmatch signal unmatch1 becomes low potential, that is, match state. The AND logic result of the second unmatch signal unmatch1 and the second select signal select1 becomes a drive timing control signal enb1 via the second D-type latch circuit 492 controlled by the clock signal. Then, the AND logic result is inputted to the second tri-state buffer 7-1. In this case, the second drive timing control signal enb1 is low potential, that is, non-active state. Thus, the second tri-state buffer 7-1 becomes high impedance state regardless of each state of the second data signal data1 and the clock signal. Other tri-state buffers 7-0, 7-2 and 7-3 becomes high impedance state because select signals select0, select1 and select2 are individually low potential, that is, non-active state. All tri-state buffer s connected to the common line 1 are high impedance state. Therefore, the state of the common line 1 is kept at the old high potential (state "1") by the state holding circuit 5. As a result, the output signal out is kept at the state "1". This is the desired result because the selected second data signal data1 is high potential, that is, state "1". In the third embodiment, if the selected second data signal matches with the result of the output signal out, all tri-state buffers 7-i become high impedance state. Thus, the state of the old output signal out is kept.

In the phase7-0, several signals are individually in the following state when the clock signal transfers to high potential. More specifically, the first and second select signals select0 and select1 are both high potential, that is, multiple-select state. The first data signal data0 is high potential, and the second data signal data1 is low potential; in other words, these data signals are mutually different state. In this case, since the common line 1 is high potential, it matches with the state of the first data signal data0. Therefore, as described in the phase4-0, the operation is the same as the case where the selected data signal matches with the result of the output signal out. As a result, the first tri-state buffer 7-0 becomes high impedance state. On the other hand, the second unmatch signal unmatch1 becomes high potential, that is, unmatch state. The unmatch state is given, and thereby, the second drive timing control signal enb1 becomes high potential, that is, active state. The control signal enb1 is given, and thereby, the second tri-state buffer 7-1 drives the common line 1 to low potential.

The multiplexer circuit of the third embodiment does not require a pre-charge operation; therefore, high-speed cycle operation is achieved. In addition, even if various multiple-select states are given, no short-circuit current flows through the circuit; therefore, it is possible to prevent elements and interconnections from being broken down by excessive current. The state of the output signal out is uniquely determined in the multiple-select state. If the output signal out and all data signals datai have the same state in the multiple-select state, the state of the output signal out is kept. If data signal datai having different state exists only one, the state of the output signal out is inverted.

Fourth Embodiment

Figure 7:
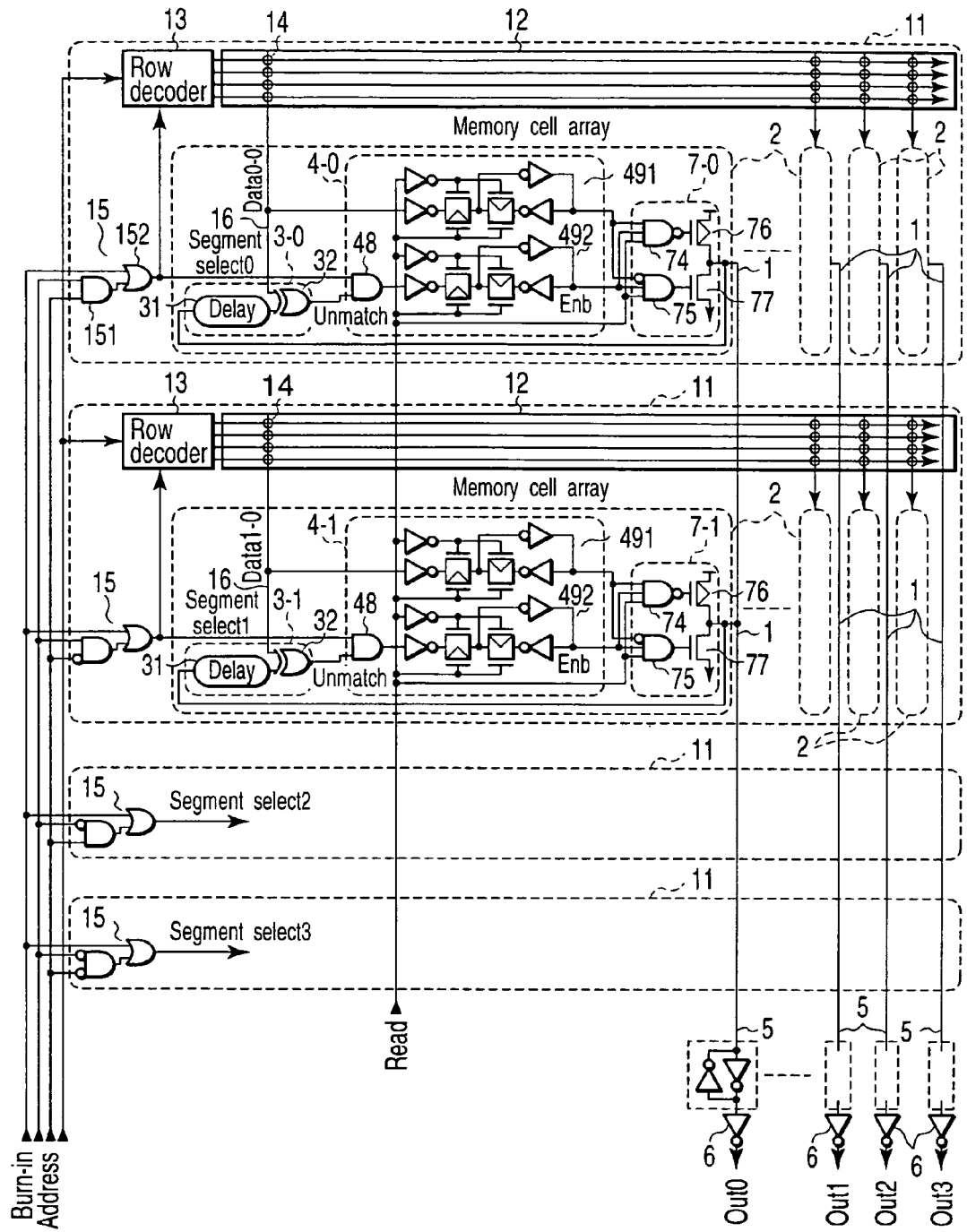
FIG. 7 is a circuit diagram showing part of a semiconductor memory device using a multiplexer circuit according to a fourth embodiment of the present invention.

FIG. 7 is a circuit diagram showing the configuration of a semiconductor memory device according to a fourth embodiment, for example, Dynamic Random Access Memory (DRAM). The multiplexer circuit of the third embodiment described in FIG. 5 is applied to a data read out circuit. The same reference numerals are used to designate components corresponding to FIG. 5, and the details are omitted.

The DRAM shown in FIG. 7 has several, that is, four memory segments 11 in the fourth embodiment. The memory segments 11 each include memory cell array 12, segment select circuit 15, row decoder 13, several data lines 16, and several basic unit circuits 2. The memory cell array 12 has a great many of memory cells arrayed like a matrix. The segment select circuit 15 is supplied with segment select address signal (address) and burn-in signal (burn-in), and outputs a segment select signal selecti. The row decoder 13 is supplied with the segment select signal selecti and an address signal to select a row of the memory cell array 12. The data lines 16 are supplied with several bit data signal datai-j (i=0~3, j=0~n, n is positive integer) read from memory cells 14 included in one row selected by the row decoder 13. The basic unit circuits 2 are connected to the data lines 16.

In several basic unit circuits 2 provided for each memory segment 11, several, that is, four basic unit circuits 2 of the corresponding column each have an output nodes connected to each of several common lines 1. In this case, the common lines 1 are each provided with a synchronous multiplexer circuit, which is driven by a read control signal (read). In other words, several basic unit circuits 2 included in the multiplexer circuit are dispersedly arranged in each memory segment 11.

The segment select circuit 15 has an AND logic circuit 151 and an OR logic circuit 152. The AND logic circuit 151 inputs the segment select address signal. The OR logic circuit 152 inputs an output signal of the AND logic circuit 151 and the burn-in signal.

The operation of the DRAM in the normal use will be explained below. In the normally using state, the burn-in signal is fixed to low potential. An address signal of the memory cell to be accessed is given. The address signal is composed of several bit signals, and one of four memory segments 11 is selected in accordance with the combination of upper two bit address signals. The segment select signal (segment selecti) and lower several bit signals of the address signal are inputted to the row decoder 13. In accordance with the combination of these signals, the row decoder 13 selects memory cells corresponding to one row of matrix-like arrayed memory cells. Data signals datai-j are read from memory cells 14 of the selected one row to several data lines 16. Thereafter, the data signals datai-j are outputted to several common lines 1 via unmatch detection circuit 3-i, drive timing control circuit 4-i and tri-state buffer 7-i included in several basic unit circuits 2. An output signal (out) is read via the state holding circuit 5 and the output buffer 6. The operation is the same as the third embodiment described in FIG. 6; therefore, the explanation is omitted.

The burn-in operation after the DRAM is packaged will be explained below. Burn-in of the semiconductor memory device is one kind of the test carried out in the final manufacturing process. The burn-in test includes the following process. The semiconductor memory device is operated under voltage and temperature higher than the normal using condition to cause random failure existing in the device. The foregoing burn-in test is carried out, and thereby, the normal operation becomes unstable in the semiconductor memory device containing the random failure. The random failure is detected via the final package test, and thereafter, eliminated, and thereby, the product quality is secured. It is the principal object of the burn-in test to give electrical stress to circuit elements and interconnections. In the semiconductor memory device, it is important whether stress is effectively given to memory cells. Peripheral circuits provided around the memory cell array receive one electrical stress in one-time or several times access operations. On the contrary, the matrix-like arrayed memory cells receive one electrical stress in several thousands of accesses. In order to give many electrical stresses to memory cells as much as possible, the process of simultaneously activating several memory segments is employed. In the DRAM of the fourth embodiment, the burn-in signal is inputted to realize the foregoing burn-in test.

The burn-in signal is set to high potential, and thereby, all memory segments 11 are selected regardless of the state of the address signal. In other words, data read from memory cells of several memory segments 11 is read at a time in the burn-in operation. There exists the case where several data read at a time are mutually different. For example, this results from permanent failure of read data due to random failure or soft error of memory data by the influence of cosmic radiation. In this case, several read data collide with each other at one common line 1, and short-circuit current flows via the common line 1. Thus, stress more than the necessity is given to elements and interconnections. In particular, burn-in is carried out under high temperature environment using high voltage power source; for this reason, the problem is serious. If the foregoing short-circuit phenomenon occurs simultaneously in several common lines 1 and LSI, there is a possibility that the expensive burn-in system is broken down.

As described above, the synchronous multiplexer circuit built in the DRAM of the fourth embodiment does not require a pre-charge operation; therefore, high-speed cycle operation is achieved. In any cases, no short-circuit current flows in the common line 1 connected commonly with several basic unit circuits 2. Therefore, it is possible to avoid the possibility of giving stress more than the necessity to elements and interconnections or breaking down the expensive burn-in system.

Fifth Embodiment

Figure 8:
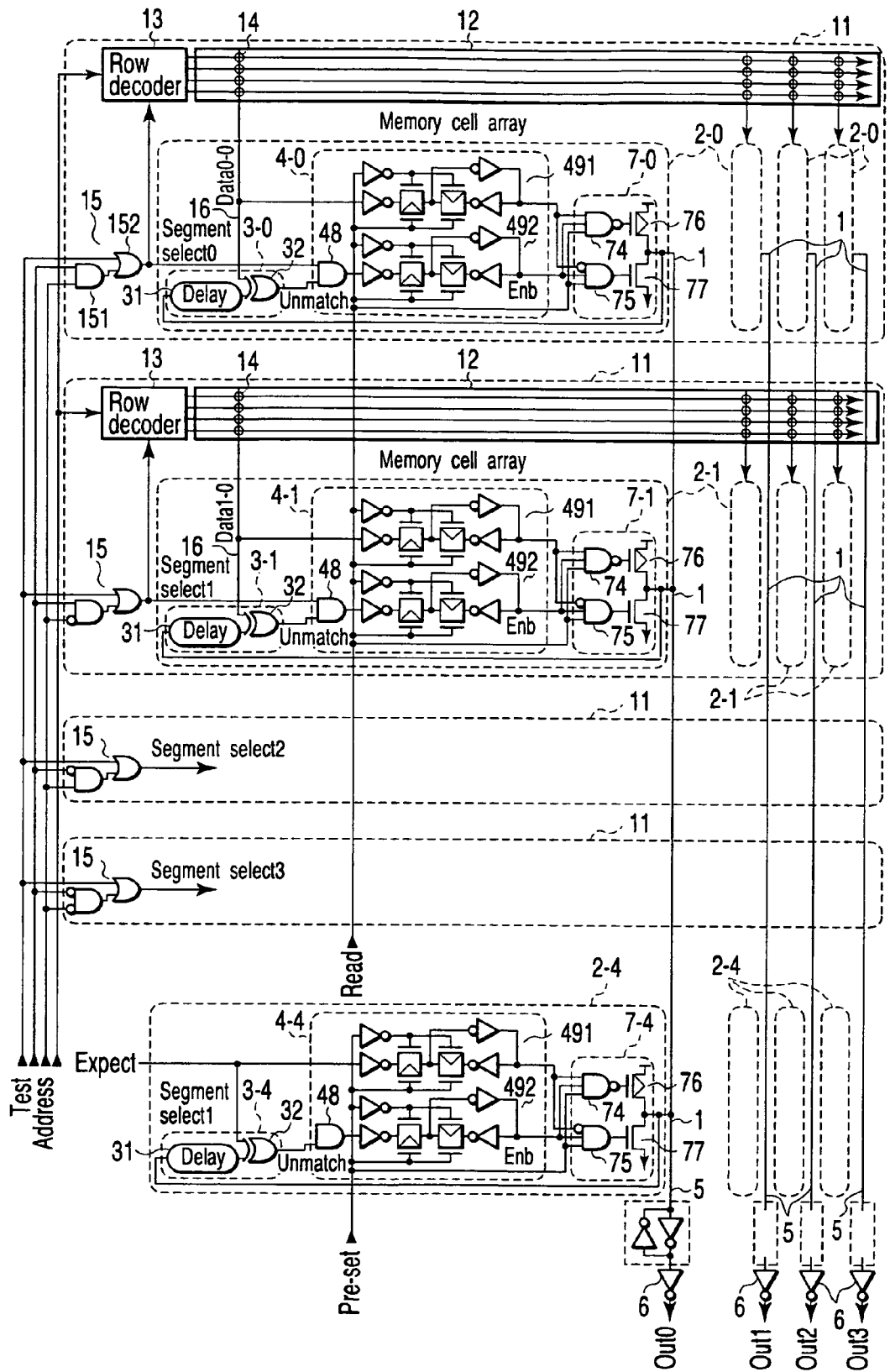
FIG. 8 is a circuit diagram showing part of a semiconductor memory device using a multiplexer circuit according to a fifth embodiment of the present invention.

FIG. 8 is a circuit diagram showing the configuration of a semiconductor memory device according to a fifth embodiment, for example, Dynamic Random Access Memory (DRAM). The DRAM of the fifth embodiment is an improved type of the DRAM of the fourth embodiment described in FIG. 7, and applied to a parallel test for several memory segments 11.

A multiplexer circuit built in the DRAM of the fifth embodiment positively uses the characteristic given below. In brief, if all data are the same state with respect to the state of the common line 1 in a multiple-select state, the common line 1 keeps the old state. If only one different data exists, the state of the common line 1 is inverted. The DRAM of the fifth embodiment differs from the DRAM of the fourth embodiment described in FIG. 7 in the following points. More specifically, several basic unit circuits 2-4 for writing expected values are newly added, and a test signal (test) is used in place of the burn-in signal (burn-in). Other configuration is the same; therefore, the reference numerals identical to FIG. 7 are used. The basic unit circuits 2-4 for writing expected values are provided by the number corresponding to memory cells included in one row of each memory cell array 12, that is, j.

The output nodes of j-basic unit circuits 2-4 are connected to the common line of the corresponding column of the memory cell array 12, like other basic unit circuits 2-0 to 2-2. The basic unit circuit 2-4 has the same configuration as other basic unit circuits 2, and therefore, has unmatch detection circuit 3-4, drive timing control circuit 4-4 and tri-state buffer 7-4. In the basic unit circuit 2-4, an expected value data signal (expect) is inputted to the exclusive OR circuit 32 in place of the data signal datai-j. In addition, an expected value write control signal, that is, preset signal (pre-set) is inputted to two D-type latch circuits 491 and 492 in place of the read signal (read).

Figure 9:
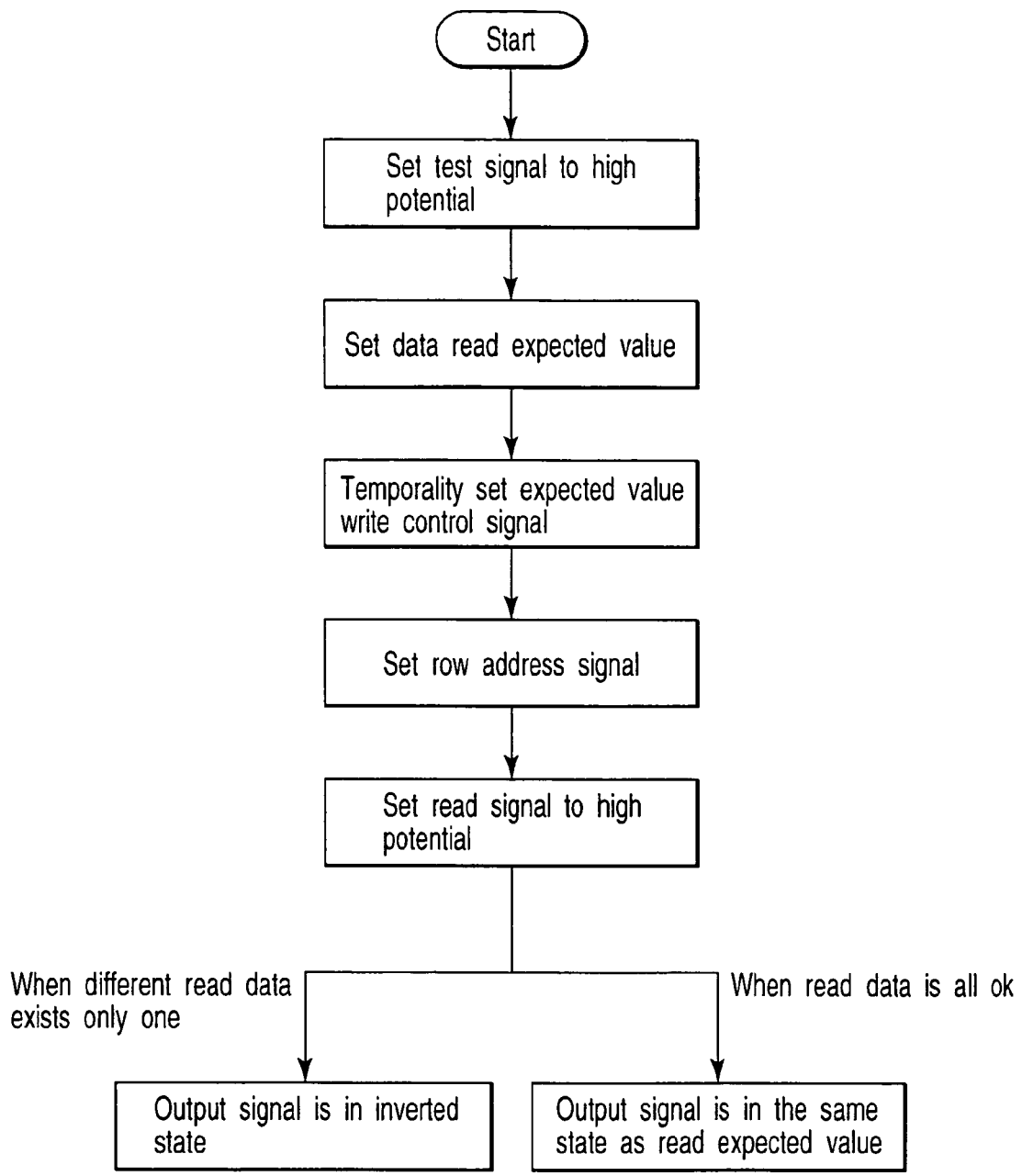
FIG. 9 is a flowchart to explain a parallel test method of several memory segments in the semiconductor memory device shown in FIG. 8

FIG. 9 is a flowchart to explain the parallel test method for several memory segments included in the DRAM of FIG. 8. First, the test signal is set to high potential. By doing so, four memory segments 11 are simultaneously selected. A read expected value data signal of each data is set. The expected value write control signal is set to high potential, and thereafter, is again returned to low potential. Preset of the common line 1 by the read expected value data signal is completed. Then, row address of the memory cell to be accessed is set as address signal. Since all memory segments 11 are previously selected by the test signal, upper two bits selecting memory segments 11 are invalid in the address signal. When the read signal is set to high potential in this state, basic unit circuits 2-0 to 2-3 each compare data of the read memory cell 14 with data by the read expected value data signal preset in the common line 1. If all data of read several memory cells 14 are the same as the read expected value preset in the common line 1, the output signal out becomes an expected value. If only one different data exists, the state of the output signal out is inverted.

Thus, according to the fifth embodiment, the parallel test is carried out with respect to memory cells 14 of several memory segments 11 included in the DRAM; as a result, the test time is shortened.

Sixth Embodiment

Figure 10:
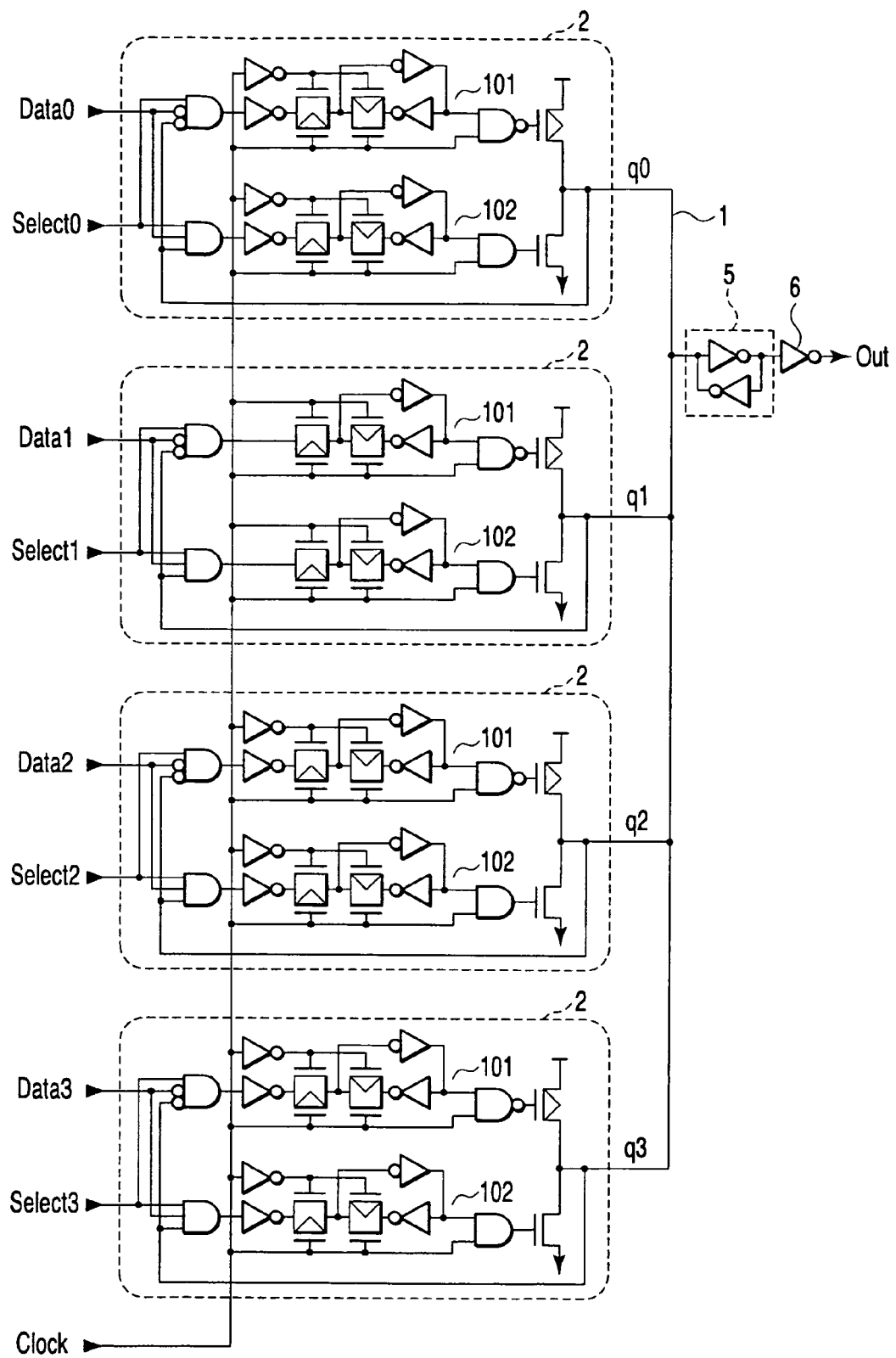
FIG. 10 is a circuit diagram showing the configuration of a multiplexer circuit according to a sixth embodiment of the present invention.

FIG. 10 is a circuit diagram showing the configuration of a multiplexer circuit according to a sixth embodiment. The multiplexer circuit of the sixth embodiment has the configuration improving the basic unit circuit 2 included in the multiplexer circuit of the third embodiment described in FIG. 5.

The basic unit circuit 2 differs from that shown in FIG. 5 in the following point, as shown in FIG. 10. More specifically, three circuits, that is, unmatch detection circuit 3-i, drive timing control circuit 4-i and tri-state buffer 7-i are fully integrally formed according to logical conversion without being distinguished. In FIG. 10, 101 and 102 denote D-type latch circuit. The operation of each basic unit circuit 2 shown in FIG. 10 is the same as that shown in FIG. 9.

As described in the sixth embodiment, various configurations may be given to realize the basic unit circuit. The multiplexer circuits according to the foregoing embodiments have the following features. The basic unit circuit 2 capable of realizing truth state shown in the following Table 1 is prepared, and the output node is connected to the common line 1.

TABLE 1

| Select signal (select) | Data signal (data) | Old state of output signal ($out_{old}$) | Drive state of tri-state buffer (q) | New state of output signal ($out_{new}$) |
|---|---|---|---|---|
| 0 | X | 0 | Hi-Z | 0 |
| 0 | X | 1 | Hi-Z | 1 |
| 1 | 0 | 0 | Hi-Z | 0 |
| 1 | 0 | 1 | 0 | 0 |
| 1 | 1 | 0 | 1 | 1 |
| 1 | 1 | 1 | Hi-Z | 1 |

Seventh Embodiment

Figure 11:
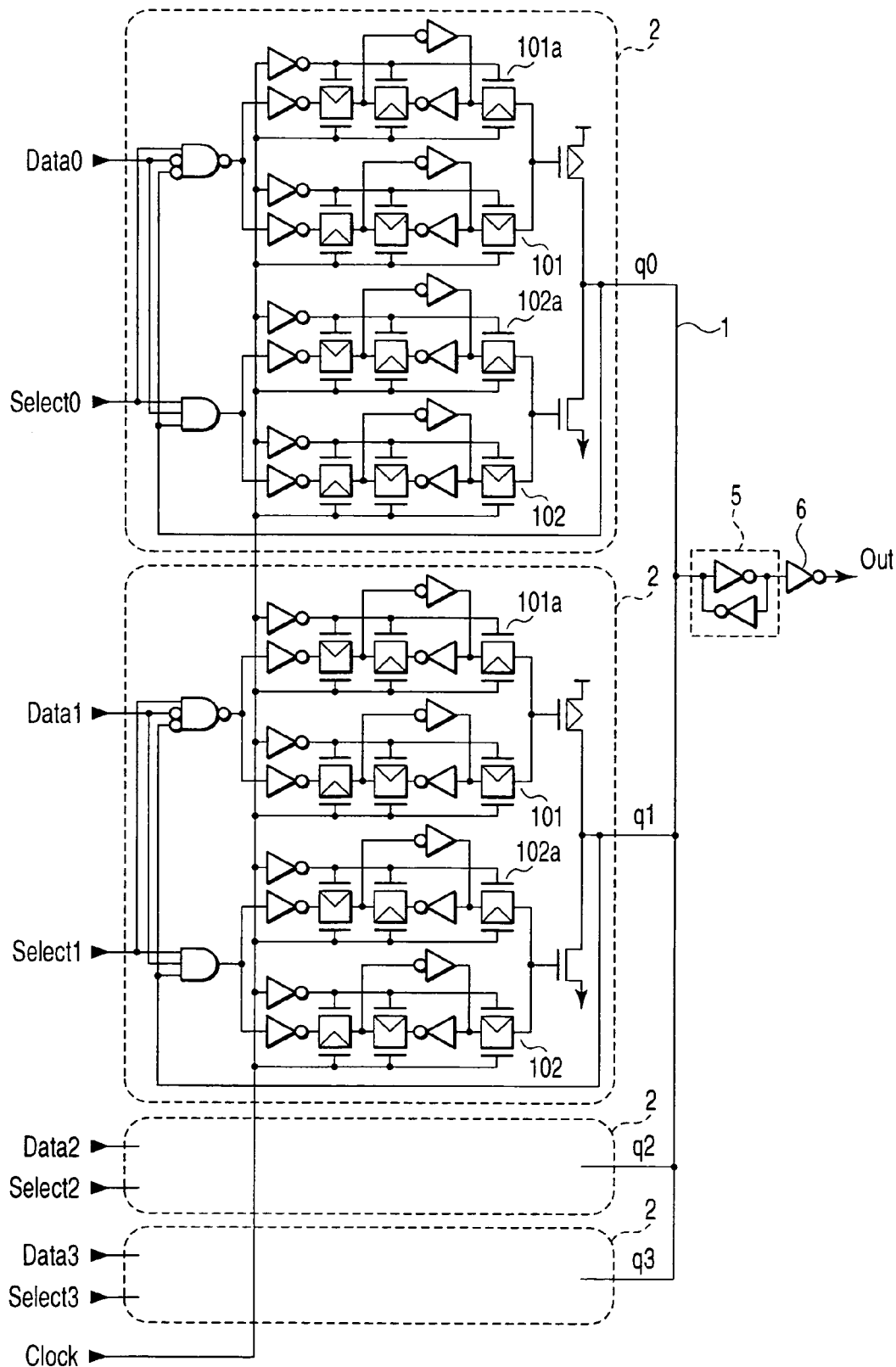
FIG. 11 is a circuit diagram showing the configuration of an asynchronous multiplexer circuit according to a seventh embodiment of the present invention.

FIG. 11 is a circuit diagram showing the configuration of a multiplexer circuit according to a seventh embodiment. The multiplexer circuit of the seventh embodiment has the configuration improving the multiplexer circuit of the sixth embodiment described in FIG. 10. More specifically, each basic unit circuit 2 is newly provided with D-type latch circuits 101a and 102a in addition to the foregoing D-type latch circuits 101 and 102. That is, each basic unit circuit 2 is provided two times as much as the sixth embodiment. The newly provided D-type latch circuits 101a and 102a capture the data signal datai and the state of the select signal selecti when the clock signal transfers from high potential to low potential. These D-type latch circuits 101a and 102a keep the state for the period when the clock signal is low potential.

Figure 12:
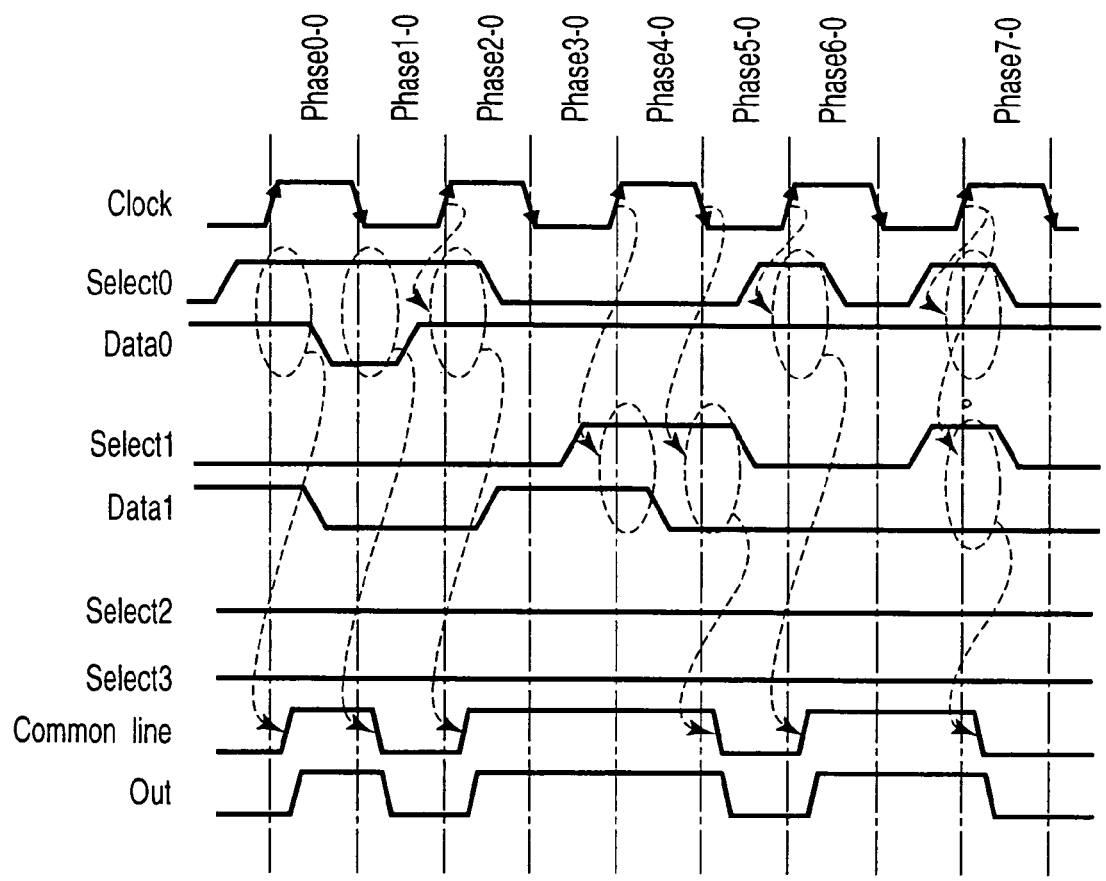
FIG. 12 is a waveform chart to explain the operation of the multiplexer circuit shown in FIG. 11.

FIG. 12 is a waveform chart to explain the operation of the multiplexer circuit shown in FIG. 11. The operation is the same as the multiplexer circuit of the third embodiment described in FIG. 6; therefore, the explanation is omitted.

In each basic unit circuit 2 shown in FIG. 11, logic for obtaining the state of output node qi from select signal selecti, data signal datai and the potential of the common line 1 is the same truth as described in the Table 1.

Thus, the synchronous multiplexer circuit of the seventh embodiment does not require a pre-charge operation; therefore, high-speed cycle operation is achieved. In addition, a double data rate (DDR) operation is realized such that the state of the output signal changes at both the rise and the fall edges of the clock signal. Therefore, the synchronous multiplexer circuit of the seventh embodiment is readily applicable to DRAM used for the system in which the external system employs the DDR operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents. In the foregoing embodiments, DRAM is given as the example of the semiconductor memory device. The semiconductor memory device is not limited to the DRAM.

What is claimed is:

1. A multiplexer circuit comprising:
a plurality of basic unit circuits each supplied with a data signal and a select signal, and having an output terminal;
a common line connected commonly to the output terminal of said plurality of basic unit circuits; and
an output buffer connected to the common line, and outputting the signal of the common line,
said plurality of basic unit circuits each including:
an unmatch detection circuit configured to detect an unmatch state of the data signal with the signal of the common line; and
a tri-state buffer connected to the unmatch detection circuit, and driving the common line according to a state of the data signal when the unmatch detection circuit detects an unmatch state of the data signal with the signal of the common line.

2. The multiplexer circuit according to claim 1, further comprising:
a data holding circuit connected to the common line, and holding a signal of the common line.

3. The multiplexer circuit according to claim 1, wherein said plurality of basic unit circuits each further include a drive timing control circuit configured to control drive timing of the common line when receiving a state transition of the select signal, and
the tri-state buffer drives the common line according to a state of the data signal when an output signal of the unmatch detection circuit and an output signal of the drive timing control circuit are both active state.

4. The multiplexer circuit according to claim 3, wherein the drive timing control circuit controls the drive timing of the common line when receiving a state transition of the data signal with the state transition of the select signal.

5. The multiplexer circuit according to claim 3, wherein the unmatch detection circuit includes:
a first inverter circuit connected to the common line, and inverting a signal of the common line; and
a first exclusive OR logic circuit supplied with the data signal and an output signal of the inverter circuit.

6. The multiplexer circuit according to claim 3, wherein the drive timing control circuit includes:
a first delay circuit delaying the select signal;
a first inverter circuit inverting an output signal of the first delay circuit;
a first AND logic circuit supplied with the select signal and an output signal of the first inverter circuit;
a second delay circuit delaying the data signal;
a first exclusive OR logic circuit supplied with the data signal and an output signal of the second delay circuit;
a second AND logic circuit supplied with the select signal and an output signal of the first exclusive OR logic circuit; and
an OR logic circuit supplied with output signals of the first and second AND logic circuits.

7. The multiplexer circuit according to claim 3, wherein the drive timing control circuit includes:
a first delay circuit delaying the select signal;
a first inverter circuit inverting an output signal of the first delay circuit; and
a first AND logic circuit supplied with the select signal and an output signal of the first inverter circuit.

8. The multiplexer circuit according to claim 3, wherein the tri-state buffer includes:
a first AND logic circuit supplied with output signals of the unmatch detection circuit and the drive timing control circuit;
a first inverter circuit inverting an output signal of the first AND logic circuit; and
a clocked inverter circuit supplied with the data signal and having an output terminal connected to the common line, the operation of the clocked inverter circuit is controlled in accordance with output signals of the first AND logic circuit and the first inverter circuit.

9. A multiplexer circuit comprising:
a plurality of basic unit circuits each supplied with a data signal and a select signal, commonly supplied with a clock signal for controlling operation timing, and having an output terminal;
a common line connected commonly to the output terminal of said plurality of basic unit circuits; and
an output buffer connected to the common line, and outputting the signal of the common line, said plurality of basic unit circuits each including:
an unmatch detection circuit detecting unmatch of the data signal with the signal of the common line;
a drive timing control circuit supplied with an output signal of the unmatch detection circuit, the data signal and the select signal, and outputting the select signal and the select signal in accordance with the output signal of the unmatch detection circuit when the clock signal is in a non-active state while keeping an old output state when the clock signal is in an active state; and
a tri-state buffer receiving an output signal of the drive timing control circuit, and driving the common line according to a state of the data signal when the clock signal is in an active state.

10. The multiplexer circuit according to claim 9, further comprising:
a data holding circuit connected to the common line, and holding a signal of the common line.

11. The multiplexer circuit according to claim 9, wherein the unmatch detection circuit includes:
a delay circuit delaying a signal of the common line; and
an exclusive OR logic circuit supplied with the data signal and an output signal of the delay circuit.

12. The multiplexer circuit according to claim 9, wherein the drive timing control circuit includes:
a first AND logic circuit supplied with the select signal and an output signal of the unmatch detection circuit;
a first latch circuit latching the data signal in synchronous with the clock signal; and
a second latch circuit latching an output signal of the first AND logic circuit in synchronous with the clock signal.

13. The multiplexer circuit according to claim 12, wherein the tri-state buffer includes:
a second AND logic circuit supplied with an output signal of the first latch circuit, an output signal of the second latch circuit and the clock signal;
a third AND logic circuit supplied with an inverted signal of the output signal of the first latch circuit, the output signal of the second latch circuit and the clock signal;
a first transistor having a current path interposed between a first power supply voltage supply node and the common line, and having a gate supplied with an output signal of the second AND logic circuit; and
a second transistor having a current path interposed between a second power supply voltage supply node and the common line, and having a gate supplied with an output signal of the third AND logic circuit.

14. A semiconductor memory circuit device comprising:
a plurality of memory segments each including:
a memory cell array having matrix-like arrayed memory cells; a row decoder for selecting one row of the memory cell array; a segment select circuit outputting a segment select signal for selecting the row decoder in accordance with a first control signal and an address signal; a plurality of data lines outputting a plurality of-bit read data read from the row of the memory cell array selected by the row decoder; and
a plurality of first basic unit circuits each having an output terminal, supplied with the segment select signal and a second control signal, and provided by the number corresponding to said plurality of data lines;
a plurality of common lines connected commonly with the output terminals of several basic unit circuits of the corresponding column of said plurality of first basic unit circuits; and
a plurality of output buffer s connected to said plurality of common lines, and outputting signals of said plurality of common lines,
said plurality of first basic unit circuits each including:
a first unmatch detection circuit detecting an unmatch state of each data signal with each signal of the common lines;
a first drive timing control circuit supplied with an output signal of the first unmatch detection circuit, the data signal, the segment select signal and the second control signal, outputting the select signal and an output signal of the segment select circuit in accordance with the output signal of the first unmatch detection circuit when the second control signal is in a non-active state while keeping an old output state when the second control signal is in an active state; and
a first tri-state buffer receiving an output signal of the first drive timing generator circuit, driving each of said plurality of common lines according to a state of the data signal in synchronous with the second control signal, and keeping a state for an active period of the second control signal while the output becomes high impedance state when the second control signal becomes a non-active state;
in a normal operation, memory cells included in one row of one memory segment being selected by the combination of the segment select signal and the address signal, and data signals read from memory cells equivalent to one row being each outputted to the corresponding common lines via the corresponding first basic unit circuits,
in a burn-in operation in a state after the device is packaged, a plurality of segment signals being simultaneously activated regardless of a state of the address signal, and a plurality of data signals read from memory cells included in all memory segments being read in parallel to said plurality of common lines via said plurality of first basic unit circuits.

15. The device according to claim 14, further comprising:
a plurality of data holding circuits connected to said plurality of common lines, and holding signals of said plurality of common lines.

16. The device according to claim 14, wherein the first unmatch detection circuit includes:
a delay circuit delaying a signal of the common line; and
an exclusive OR logic circuit supplied with the data signal and an output signal of the delay circuit.

17. The device according to claim 14, wherein the first drive timing control circuit includes:
a first AND logic circuit supplied with the segment select signal and an output signal of the first unmatch detection circuit;
a first latch circuit latching the data signal in synchronous with the second control signal; and a second latch circuit latching an output signal of the first AND logic circuit in synchronous with the second control signal.

18. The device according to claim 17, wherein the first tri-state buffer includes:
a second AND logic circuit supplied with an output signal of the first latch circuit, an output signal of the second latch circuit and the second control signal;
a third AND logic circuit supplied with an inverted signal of the output signal of the first latch circuit, the output signal of the second latch circuit and the second control signal;
a first transistor having a current path interposed between a power supply voltage node and the common line, and having a gate supplied with an output signal of the second AND logic circuit; and
a second transistor having a current path interposed between a ground voltage node and the common line, and having a gate supplied with an output signal of the third AND logic circuit.

19. The device according to claim 14, further comprising:
a plurality of second basic unit circuits for writing expected values, provided commonly with respect to said plurality of memory segments, having output terminals connected to said plurality of common lines, and supplied with a read expected value data signal and a third control signal for writing expected values,
said plurality of second basic unit circuits each including:
a second unmatch detection circuit detecting an unmatch state of the read expected value data signal with signals of the common lines;
a second drive timing control circuit supplied with an output signal of the second unmatch detection circuit, the read expected value data signal and the third control signal, outputting the read expected value data signal and an output signal of the output signal of the second unmatch detection circuit when the third control signal is in a non-active state while keeping an output when the third control signal is in an active state; and
a second tri-state buffer receiving an output signal of the second drive timing control circuit, driving said plurality of common lines according to a state of the read expected value data signal in synchronous with the third control signal, and keeping an old state for an active period of the third control signal while the output becomes high impedance state when the third control signal becomes a non-active state.

20. The device according to claim 19, wherein the second unmatch detection circuit includes:
a first delay circuit delaying a signal of the common line; and
a first exclusive OR logic circuit supplied with the read expected value data signal and an output signal of the first delay circuit.

21. The device according to claim 19, wherein the second drive timing control circuit includes:
a first latch circuit latching the read expected value data signal in synchronous with the third control signal; and
a second latch circuit latching an output signal of the second unmatch detection circuit in synchronous with the third control signal.

22. The device according to claim 21, wherein the second tri-state buffer includes:
a first AND logic circuit supplied with an output signal of the first latch circuit, an output signal of the second latch circuit and the third control signal;
a second AND logic circuit supplied with an inverted signal of the output signal of the first latch circuit, the output signal of the second latch circuit and the third control signal;
a first transistor having a current path interposed between a first power supply voltage supply node and the common line, and having a gate supplied with an output signal of the first AND logic circuit; and
a second transistor having a current path interposed between a second power supply voltage supply node and the common line, and having a gate supplied with an output signal of the second AND logic circuit.

23. A method of testing a semiconductor memory circuit device including,
a plurality of memory segments each including,
a memory cell array having matrix-like arrayed memory cells;
a row decoder for selecting one row of the memory cell array;
a segment select circuit outputting a segment select signal for selecting the row decoder in accordance with a first control signal and an address signal;
a plurality of data lines outputting a plurality of-bit read data read from the row of the memory cell array selected by the row decoder; and
a plurality of first basic unit circuits each having an output terminal, supplied with the segment select signal and a second control signal, and provided by the number corresponding to said plurality of data lines;
a plurality of common lines connected commonly with the output terminals of several basic unit circuits of the corresponding column of said plurality of first basic unit circuits;
a plurality of output buffer s connected to said plurality of common lines, and outputting signals of said plurality of common lines; and
a plurality of second basic unit circuits for writing expected values, provided commonly with respect to said plurality of memory segments, having output terminals connected to said plurality of common lines, and supplied with a read expected value data signal and a third control signal for writing expected values,
the method comprising:
simultaneously selecting said plurality of memory segments, temporarily activating the third control signal after setting the read expected data signal, and setting data of the common lines by the second basic unit circuits in accordance with the read expected data signal;
selecting several memory cells included in said plurality of memory segments according to the address signal, and inputting data signals read from said plurality of memory cells to the corresponding first basic unit circuits; and
carrying out a parallel test with respect to memory cells included in said plurality of memory segments according to a state transition such that the output signal of the output buffer is unchanged if all data read from said plurality of memory cells are identical to data preset in the common line while the output signal becomes an inverted state if only one different data exists.

* * * * *